(12) United States Patent
Jin et al.

(10) Patent No.: US 10,297,378 B2
(45) Date of Patent: May 21, 2019

(54) STANDARD INDUCTANCE BOX

(71) Applicant: CHENGDU KAIPU ELECTRONIC SCIENCE AND TECHNOLOGIES CO. LTD., Chengdu, Sichuan (CN)

(72) Inventors: Pan Jin, Chengdu (CN); Dian Jin, Chengdu (CN)

(73) Assignee: CHENGDU KAIPU ELECTRONIC SCIENCE AND TECHNOLOGIES CO. LTD., Chengdu (CN)

( * ) Notice: Subject to any disclaimer, the term of this patent is extended or adjusted under 35 U.S.C. 154(b) by 124 days.

(21) Appl. No.: 15/103,308

(22) PCT Filed: Dec. 1, 2014

(86) PCT No.: PCT/CN2014/092629
§ 371 (c)(1),
(2) Date: Jun. 9, 2016

(87) PCT Pub. No.: WO2015/085876
PCT Pub. Date: Jun. 18, 2015

(65) Prior Publication Data
US 2016/0293313 A1    Oct. 6, 2016

(30) Foreign Application Priority Data
Dec. 10, 2013   (CN) .......................... 2013 1 0664625

(51) Int. Cl.
*H01F 21/12* (2006.01)
*H01F 21/02* (2006.01)
(Continued)

(52) U.S. Cl.
CPC .............. *H01F 21/12* (2013.01); *G01R 1/28* (2013.01); *G01R 35/005* (2013.01); *H01F 27/02* (2013.01); *H01F 27/24* (2013.01); *H01F 27/28* (2013.01)

(58) Field of Classification Search
CPC .......... H01F 21/12; H01F 27/02; H01F 27/28; H01F 27/24; H01F 27/04; H01F 27/027;
(Continued)

(56) References Cited

U.S. PATENT DOCUMENTS

| 3,395,336 A * | 7/1968 | Weeman ................ H01F 29/02 |
| | | 323/355 |
| 4,255,734 A * | 3/1981 | Owen .................. H01H 9/0005 |
| | | 200/11 TC |
| 2014/0111297 A1 * | 4/2014 | Earhart .................. H01F 27/25 |
| | | 336/212 |

FOREIGN PATENT DOCUMENTS

CN     076545 A    9/1993
CN    1461019 A   12/2003
(Continued)

OTHER PUBLICATIONS

Feb. 11, 2015, Written Opinion of the International Searching Authority as to PCT/CN2014/092629 (Chinese).
(Continued)

*Primary Examiner* — Mang Tin Bik Lian
(74) *Attorney, Agent, or Firm* — Mei & Mark LLP

(57) ABSTRACT

A standard inductance box, relating to the fields of measurement or calibration, and relating in particular to a standard gauge for transferring an inductance parameter. The standard inductance box uses unary, binary and quinary, and comprises a physical inductance box section and a simulated inductance box section, said sections being respectively arranged in a metal box. Electrodes of the physical inductance box section and the simulated inductance box section are led out. The inductance range of the standard inductance box is 1 μH-500 H. The described means achieve an inductance range of 1 μH-500 H, expanding the inductance range in the prior art, and the application of a simulated inductance box. Using unary, binary and
(Continued)

quinary standards reduces the size and weight of the physical inductance box section, facilitating transportation and use in the field.

20 Claims, 4 Drawing Sheets

(51) Int. Cl.
*H01F 27/29* (2006.01)
*H01F 27/02* (2006.01)
*G01R 1/28* (2006.01)
*G01R 35/00* (2006.01)
*H01F 27/24* (2006.01)
*H01F 27/28* (2006.01)

(58) Field of Classification Search
CPC ...... H01F 27/29; H01F 5/04; H01F 2005/046; H01F 17/06; H01F 17/062; H01F 29/08; H01F 29/02; H01F 29/025; H01F 29/04; G01R 1/28; G01R 35/005
USPC ......... 336/90, 192, 138, 137, 140, 130, 146, 336/144, 65, 150, 147; 323/340; 200/11 TC
See application file for complete search history.

(56) References Cited

FOREIGN PATENT DOCUMENTS

| | | |
|---|---|---|
| CN | 200965546 Y | 10/2007 |
| CN | 101253586 A | 8/2008 |
| CN | 103604959 A | 2/2014 |
| CN | 103675374 A | 3/2014 |
| JP | 2000-286123 A | 10/2000 |

OTHER PUBLICATIONS

Feb. 17, 2015, International Search Report of the International Searching Authority as to PCT/CN2014/092629 (Chinese).
Aug. 11, 2015, First Office Action in Corresponding Chinese Patent Application 201310664625.3.
Nov. 5, 2015, Second Office Action in Corresponding Chinese Patent Application 2013106646253.
Mar. 15, 2016, Third Office Action in Corresponding Chinese Patent Application 201310664625.3.
CO-19, Chinese-language art (referenced in Second Office Action submitted herewith), published Oct. 1, 1990.

\* cited by examiner

STANDARD INDUCTANCE BOX

TECHNICAL FIELD OF THE INVENTION

This invention relates to the fields of measurement or calibration, especially to a standard gage for inductance unit transferring.

BACKGROUND OF THE INVENTION

In the fields of measurement or calibration, a standard inductance box (or set of inductors) is a special inductance instrument to ensure the conformity of inductance, as a standard value to transfer inductance parameters in AC parameter measurement.

In the inductance parameter measurement, the current standard inductance boxes made in China or foreign countries are decimal inductance boxes. The standard inductance box with the widest range has six series of tenfold decimal inductance box with a range from 1 µH to 1 H, which has 60 output selections of inductance values in total. However, it has disadvantages such as limited measuring range, large size, and heavy weight. Thus, it cannot achieve the whole measuring range, and it is inconvenient for field applications and transport. As to development towards future demands, the existing measurement range from 1 µH to 1 H cannot meet the requirements for inductance unit transfer and calibration. Therefore, it is required to develop a novel standard inductance box with wider range, e.g. from 1 µH to 500 H.

A standard inductance box mainly comprises standard inductors, a change-over switch, output connectors, and chassis, etc. Standard inductors may be divided into actual inductors and analogous inductors (passive). Relatively stable actual inductors are coil wound inductors, which usually have inductance from 1 µH to 1 H, and the max inductance of 10 H. However, the large value inductors have big size and heavy weight, and are inconvenient for field application. An analogous inductor is a T-type equivalent circuit. It can achieve the inductance range from 100 mH to 10000 H. Existing analogous inductors have usually single-value inductance. Current inductance boxes are made of actual inductors with the values in decimal steps from 1 µH to 1 H. In order to realize the wider inductance range in RLC digital bridge, a new standard inductance box is developed with a novel and compact design, that is light weight, and has a much wider inductance range.

SUMMARY OF THE INVENTION

The invention provides a standard inductance box with an inductance range from 1 µH to 500 H, which has a small size and is light weight to improve the existing technology. The invention has the following technical features:

A standard inductance box uses 1, 2, and 5 step increments of inductance, comprising both an actual inductance box section and an analogous inductance box section. All of the actual inductance box section and analogous inductance box section are installed in a metal box respectively, with electrodes of the actual inductance box section and the analogous inductance box section being led out.

The standard inductance box has the inductance range from 1 µH to 500 H.

The actual inductance box section includes actual inductors, actual inductance change-over switches and actual inductance output ports; the actual inductors being connected with the actual inductance change-over switch, which is connected to the actual inductance output ports; the actual inductance box section being an inductance box with 1, 2, and 5 step increments; and the inductance range of the actual inductance box section being from 1 µH to 500 mH with copper wire wounded coil on a bracelet core, which have no more than 20 splitting nodes on the coil to output.

The bracelet core is a quartz ring or a glass fiber ring.

The analogous inductance box section includes analogous inductors, an analogous inductance change-over switch, and analogous inductance output ports; the analogous inductors being connected to the analogous inductance change-over switch which is connected to the analogous inductance output ports; the analogous inductance change-over switch being used to adjust the inductance of the analogous inductors; and the inductance range of the analogous inductance box being from 1 H to 500 H.

The actual inductors consist of 1 µH, 2 µH, 5 µH, 10 µH, 20 µH, 50 µH, 100 µH, 200 µH, 500 µH; 1 mH, 2 mH, 5 mH, 10 mH, 20 mH, 50 mH, 100 mH, 200 mH, 500 mH.

The analogous inductors consist of 1 H, 2 H, 5 H, 10 H, 20 H, 50 H, 100 H, 200 H and 500 H.

There are two actual inductance change-over switches, and the actual inductance is a output is three-terminal output.

There is one analogous inductance change-over switch, and the analogous inductance output is a four-terminal output.

The electrodes of the actual inductance box and the analogous inductance box are led out through insulators.

An "Open" (open-circuit) position and a "Short" (short-circuit) position are installed in the change-over switch of analogous inductors.

Rotation angle ranges of the actual inductance change-over switches and the analogous inductance change-over switch are 360 degrees or 300 degrees.

An actual inductance box includes actual inductors, actual inductance change-over switches and actual inductance output ports; the actual inductors being connected with the actual inductance change-over switch, which is connected to the actual inductance output ports; the actual inductance box section being a inductance box with 1, 2, and 5 step increments; the inductance range of the actual inductance box section being from 1 µH to 500 mH with copper wire wounded coil on a bracelet core, which has no more than 20 splitting nodes on the coil to output.

The actual inductors consist of 1 µH, 2 µH, 5 µH, 10 µH, 20 µH, 50 µH, 100 µH, 200 µH, 500 µH; 1 mH, 2 mH, 5 mH, 10 mH, 20 mH, 50 mH, 100 mH, 200 mH, 500 mH.

The actual inductors (1 µH-500 mH) outputs in three terminals through two change-over switches, while the analogous inductors (1 H-500 H) outputs in four terminals (BNC) through one change-over switch.

The analogous inductors are defined/configured in four-terminal method. In precision tests, open-circuit compensation and short-circuit compensation are needed for the devices. So the "open-circuits" (Open) position and "short-circuit" (SHORT) position settings are very useful in accurate compensation.

Rotation angle ranges of the actual inductance change-over switches and the analogous inductance change-over switch are 360 degrees or 300 degrees.

Compared with existing technology, the invention has the following advantages:

I. The actual inductors consist of 1 µH, 2 µH, 5 µH, 10 µH, 20 µH, 50 µH, 100 µH, 200 µH, 500 µH; 1 mH, 2 mH, 5 mH, 10 mH, 20 mH, 50 mH, 100 mH, 200 mH, 500 mH. The analogous inductors consist of 1 H, 2 H, 5 H, 10 H, 20 H, 50 H, 100 H, 200 H, and 500 H. The inductance range can extend from 1 µH to 500 H based the new design, which significantly increases the inductance range of the existing inductance box with the analogous inductor's application.

II. The actual standard inductance box uses 1, 2, and 5 step increments of inductance in each decimal range, the actual inductors consist of 1 µH, 2 µH, 5 µH, 10 µH, 20 µH, 50 µH, 100 µH, 200 µH, 500 µH; 1 mH, 2 mH, 5 mH, 10 mH, 20 mH, 50 mH, 100 mH, 200 mH, 500 mH. Therefore, an actual standard inductance box can be made a smaller size and lower weight. The existing inductance box uses six series of tenfold decimal increment of inductance, which has one bracelet core respectively, with a range of 1 µH to 1 H. It has 60 output points in total. The new design of this invention uses 1, 2, and 5 step increments of inductance in each decimal range. Copper wires are wound on one bracelet core with 18 splitting outputs points in total. Therefore, it can significantly reduce the weight and size of the actual inductance box by using less inductor and less bracelet core.

EMBODIMENTS

The invention is described in details with drawings and embodiments in the following. However, the invention is not limited to the embodiments described here. The invention includes all of any new applications or new combinations based on the disclosed contents in this specification.

Figure 1:
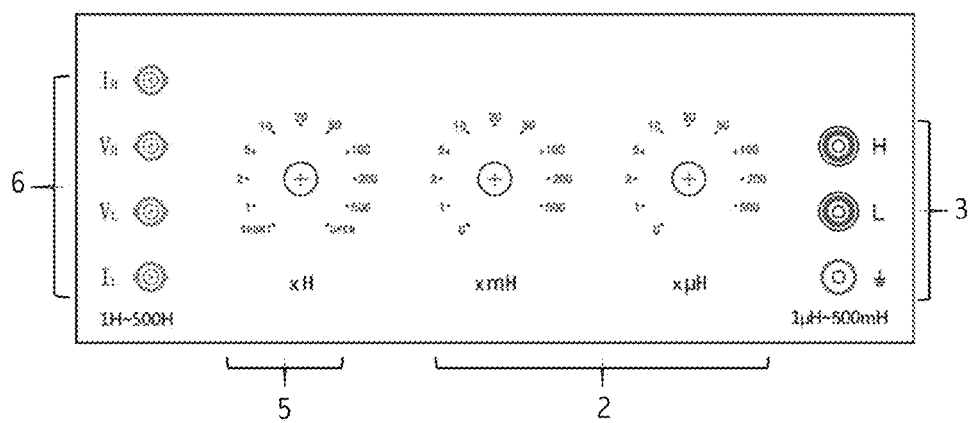
FIG. 1 is the front panel of standard inductance box using 1, 2, and 5 step increments of inductance.

As shown in FIG. 1, a standard inductance box using 1, 2, and 5 step increments of inductance includes an actual inductance box section 101 and an analogous inductance box section 102, which are installed in the metal box respectively. The electrodes of both actual inductance box section 101 and analogous inductance box section 102 are connected to the separated output ports respectively.

An inductance range of the standard inductance box herein is from 1 µH to 500 H.

The actual inductance box section 101 includes actual inductors 1, actual inductance change-over switches and actual inductance output ports. The actual inductors 1 are connected with the actual inductance change-over switch, and then connected to the actual inductance output ports.

The analogous inductance box section 102 includes analogous inductors 4, analogous inductance change-over switch and analogous inductance output ports. The analogous inductors 4 are connected with the analogous inductance change-over switch, and then connected to the analogous inductance output ports.

The actual inductors 1 consist of of 1 µH, 2 µH, 5 µH, 10 µH, 20 µH, 50 µH, 100 µH, 200 µH, 500 µH; 1 mH, 2 mH, 5 mH, 10 mH, 20 mH, 50 mH, 100 mH, 200 mH, 500 mH.

The analogous inductors 4 consist of of 1 H, 2 H, 5 H, 10 H, 20 H, 50 H, 100 H, 200 H, and 500 H.

The inductance range is extended from 1 µH to 500 H based on the above-mentioned method. The inductance range of analogous inductor's application is also increased.

Due to using 1, 2, and 5 step increments of inductance, the size and weight of the actual inductance box section 101 are reduced so that it is portable and easy to use.

There are two actual inductance change-over switches 2 and the actual inductance output port is a three-terminal output 3.

There is one analogous inductance change-over switch 5 and the analogous inductance output port is a four-terminal output 6.

The actual inductors 1 (1 µH to 500 mH) outputs to the three-terminal port 3 through two change-over switches 2, while the analogous inductors 4 (1 H to 500 H) outputs to the four-terminal port 6 (BNC) through one change-over switch 5.

The electrodes of the actual inductance box section 101 and analogous inductance box section 102 are led out through insulators 301.

"Open" position (open-circuit) and "Short" position (short-circuit) are installed in the change-over switch for analogous inductors.

The analogous inductors 4 are defined/configured in the four-terminal output 6. In precision measurement, open-circuit compensation and short-circuit compensation are needed for the device. So "open-circuit" (OPEN) and "short-circuit" (SHORT) setting in the inductance box facilitate the accurate compensation.

Rotation angle ranges of the change-over switches for actual inductance and analogous inductance are 360 degrees or 300 degrees.

Figure 2:
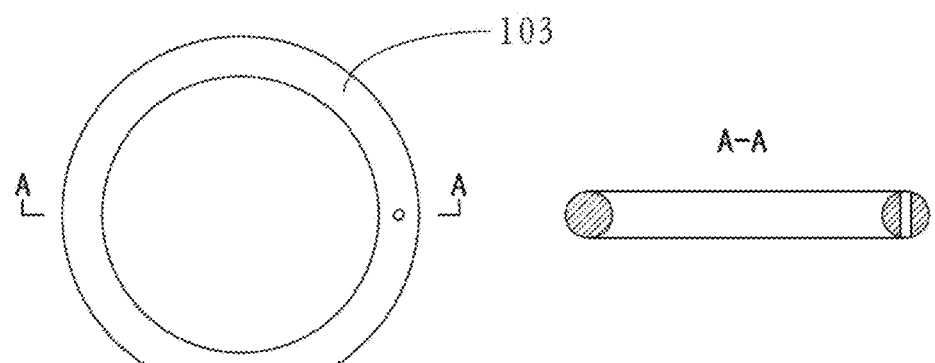
FIG. 2 is the structural diagram of bracelet core.

The actual inductors 1 is a bracelet core standard inductor as shown in FIG. 2, which is a bracelet core 103 wounded with copper wires, it has good stability and low susceptibility to ambient interference.

Figure 3:
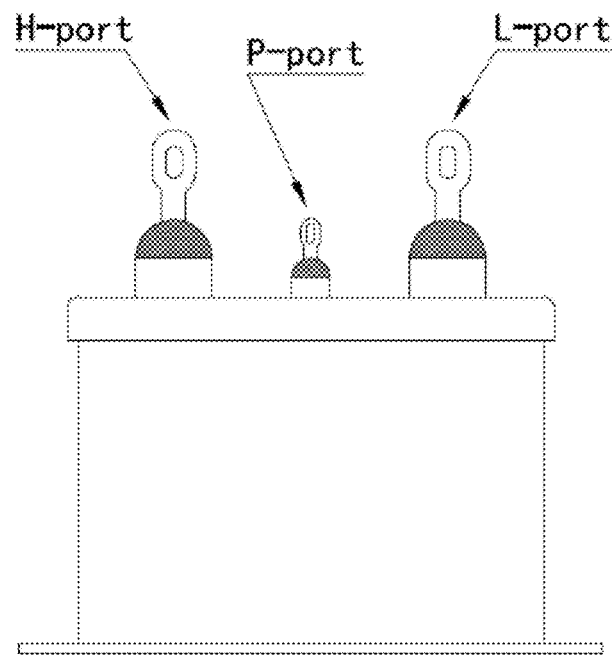
FIG. 3 is the outline of analogous inductor.

The analogous inductor is a T-type network made of resistors and capacitors, as shown in FIG. 3, which has good frequency response so that it can be used for low frequency (low frequency inductors) as well as high frequency (high frequency inductors). It has three ports: H-port is for high level output; L-port is for low level output; and P-port is for compensation on inductance at fine adjustment. It has very low susceptibility to ambient electromagnetic field, which can eliminate the influence of mutual inductance from coupling among the wires.

The actual inductors 1 and analogous inductors 4 are put into the metal box respectively, and the electrodes led out through insulators 301 so as to shield from electromagnetic field and improve its insusceptibility to ambient interference.

Figure 4:
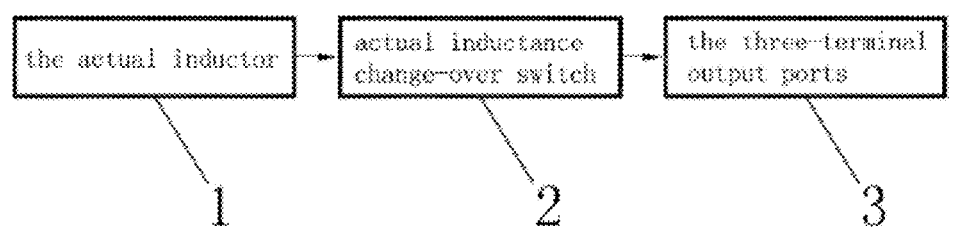
FIG. 4 is the structural block diagram of actual inductance box.
Figure 5:
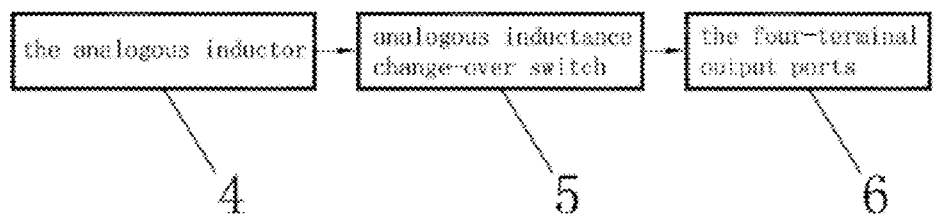
FIG. 5 is the structural block diagram of analogous inductance box.
Figure 6:
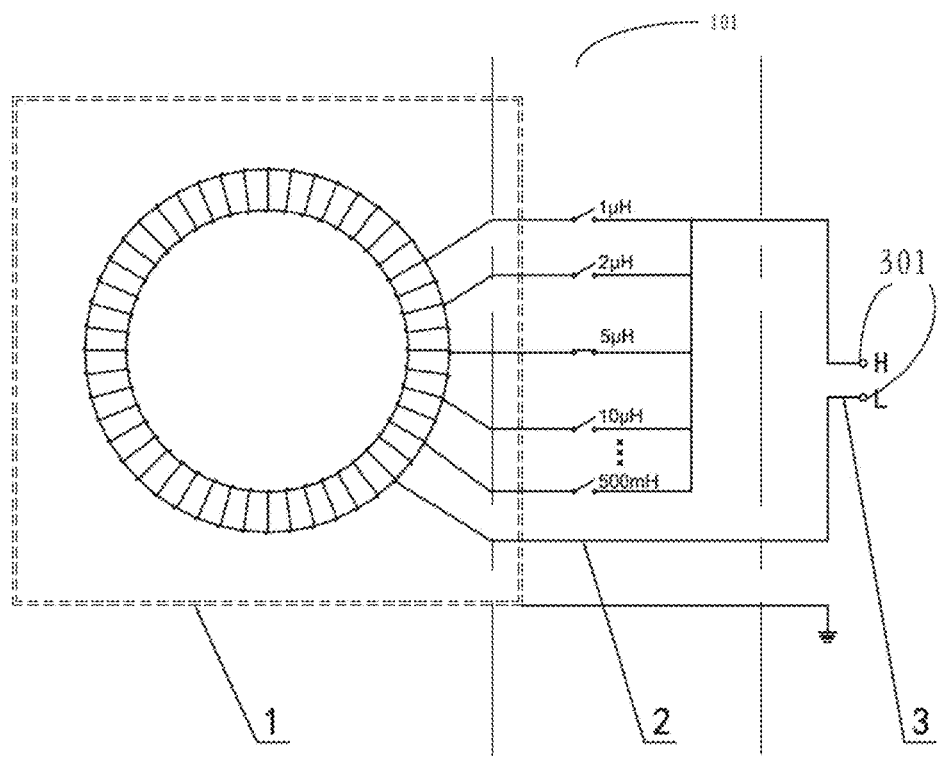
FIG. 6 is the structural diagram of actual inductance box.
Figure 7:
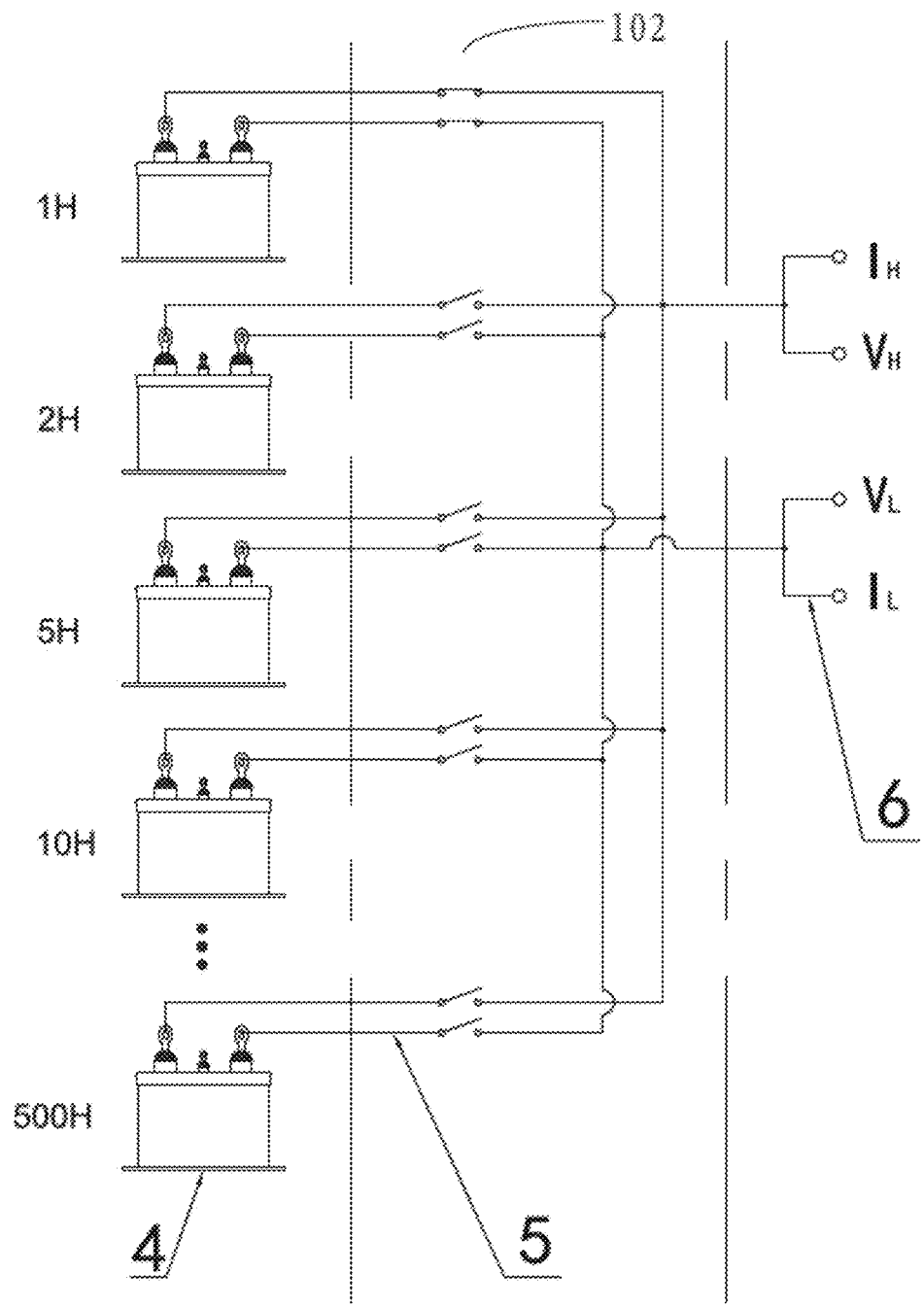
FIG. 7 is the structural diagram of analogous inductance box.

The electrodes of the actual inductors 1 and the analogous inductors 4 herein are connected to the actual change-over switch 2 and analogous change-over switch 5, respectively, outputting in three-terminal method 3 and four-terminal method 6, respectively. The electrodes of actual inductors 1 are connected to a change-over switch for actual inductors 2 and then output in three-terminal method 3. The electrodes of analogous inductors 4 are connected to a different change-over switch 5 for analogous inductors and output in four-terminal method 6. Block diagram of actual inductance box is shown in FIG. 4. Structural diagram of actual inductance box is shown in FIG. 6. Block diagram of analogous inductance box is shown in FIG. 5. Structural diagram of analogous inductance box is shown in FIG. 7.

The actual inductance box section 101 includes actual inductors 1, actual inductance change-over switch 2 and a three-terminal output port 3. The actual inductor 1 is connected with the actual inductance change-over switch 2 which is connected to the three-terminal output ports 3.

The analogous inductance box section 102 includes analogous inductors 4, a analogous inductance change-over switch 5 and a four-terminal output port 6, the analogous inductors 4 are connected with the analogous inductance change-over switch 5 which is connected to the four-terminal output port 6.

The invention claimed is:

1. A standard inductance box for measurement or calibration, comprising:
   an actual inductance box section;
   an analogous inductance box section; and
   a metal box;
      wherein
      the actual inductance box section and the analogous inductance box section are installed in the metal box;
      the standard inductance box is configured to provide variable inductance by enabling selection of a value of 0, 1, 2, or 5 in a plurality of place values of inductance;
      the standard inductance box has an inductance range of 1 µH to 500 H;
      the actual inductance box section includes actual inductors, at least one actual inductance change-over switch, and an actual inductance output port,
      the actual inductors are connected to the at least one actual inductance change-over switch, which is connected to the actual inductance output port,
      the inductance range of the actual inductance box section is from 1 µH to 500 mH;
      the actual inductance box section includes a copper wire wounded coil on a bracelet core, which has no more than 20 splitting nodes on the coil to output;
      the analogous inductance box section includes analogous inductors, at least one analogous inductance change-over switch, and an analogous inductance output port;
      the analogous inductors are connected to the at least one analogous inductance change-over switch, which is connected to the analogous inductance output port;
      the at least one analogous inductance change-over switch is used to adjust the inductance of the analogous inductors; and
      the inductance range of the analogous inductance box section is from 1 H to 500 H.

2. The standard inductance box of claim 1, wherein the bracelet core comprises a quartz ring or glass fiber ring.

3. The standard inductance box of claim 1, wherein:
   the actual inductors consist of 1 µH, 2 µH, 5 µH, 10 µH, 20 µH, 50 µH, 100 µH, 200 µH, 500 µH, 1 mH, 2 mH, 5 mH, 10 mH, 20 mH, 50 mH, 100 mH, 200 mH, and 500 mH; and
   the analogous inductors consist of 1 H, 2 H, 5 H, 10 H, 20 H, 50 H, 100 H, 200 H, and 500 H.

4. The standard inductance box of claim 1, wherein:
   the at least one actual inductance change-over switch consists of two actual inductance change-over switches; and
   the actual inductance output port comprises three terminals.

5. The standard inductance box of claim 1, wherein:
   the at least one analogous inductance change-over switch consists of one analogous inductance change-over switch; and
   the analogous output port comprises four terminals.

6. The standard inductance box of claim 1, further comprising electrodes, wherein:
   the electrodes are led out of the actual inductance box section through insulators.

7. The standard inductance box of claim 1, wherein the at least one analogous inductance change-over switch has an open position and a short position.

8. The standard inductance box of claim 2, wherein the at least one analogous inductance change-over switch has an open position and a short position.

9. The standard inductance box of claim 3, wherein the at least one analogous inductance change-over switch has an open position and a short position.

10. The standard inductance box of claim 4, wherein the at least one analogous inductance change-over switch has an open position and a short position.

11. The standard inductance box of claim 5, wherein the one analogous inductance change-over switch has an open position and a short position.

12. The standard inductance box of claim 1, wherein:
    a rotation angle of the at least one actual inductance change-over switch is 360 degrees or 300 degrees; and
    a rotation angle of the at least one analogous inductance change-over switch is 360 degrees or 300 degrees.

13. The standard inductance box of claim 2, wherein:
    a rotation angle range of the at least one actual inductance change-over switch is 300 degrees; and
    a rotation angle range of the at least one analogous inductance change-over switch is 300 degrees.

14. The standard inductance box of claim 3, wherein:
    a rotation angle range of the at least one actual inductance change-over switch is 300 degrees; and
    a rotation angle range of the at least one analogous inductance change-over switch is 300 degrees.

15. The standard inductance box of claim 4, wherein:
    a rotation angle range of the at least one actual inductance change-over switch is 300 degrees; and
    a rotation angle range of the at least one analogous inductance change-over switch is 300 degrees.

16. The standard inductance box of claim 5, wherein:
    a rotation angle range of the at least one actual inductance change-over switch is 300 degrees; and
    a rotation angle range of the at least one analogous inductance change-over switch is 300 degrees.

17. The standard inductance box of claim 1, wherein the actual inductors consist of 1 µH, 2 µH, 5 µH, 10 µH, 20 µH, 50 µH, 100 µH, 200 µH, 500 µH, 1 mH, 2 mH, 5 mH, 10 mH, 20 mH, 50 mH, 100 mH, 200 mH, and 500 mH.

18. The standard inductance box of claim 2, wherein the actual inductors consist of 1 µH, 2 µH, 5 µH, 10 µH, 20 µH, 50 µH, 100 µH, 200 µH, 500 µH, 1 mH, 2 mH, 5 mH, 10 mH, 20 mH, 50 mH, 100 mH, 200 mH, and 500 mH.

19. The standard inductance box of claim 4, wherein the actual inductors consist of 1 µH, 2 µH, 5 µH, 10 µH, 20 µH, 50 µH, 100 µH, 200 µH, 500 µH, 1 mH, 2 mH, 5 mH, 10 mH, 20 mH, 50 mH, 100 mH, 200 mH, and 500 mH.

20. A standard inductance box for measurement or calibration, comprising:
    an actual inductance box section including actual inductors, at least one actual inductance change-over switch, and at least one actual inductance output port,
       wherein
       the actual inductors are connected to the at least one actual inductance change-over switch, which is connected to the at least one actual inductance output port;

the actual inductance box section is configured to provide variable inductance by enabling selection of a value of 0, 1, 2, or 5 in a plurality of place values of inductance;

the inductance range of the actual inductor box section is from 1 µH to 500 mH; and the actual inductance box section includes a copper wire wounded coil on a bracelet core, which has no more than 20 splitting nodes on the coil to output.

* * * * *